US009222846B2

(12) United States Patent
Lim et al.

(10) Patent No.: US 9,222,846 B2
(45) Date of Patent: Dec. 29, 2015

(54) TACTILE SENSOR

(71) Applicant: SAMSUNG ELECTRONICS CO., LTD., Suwon-si (KR)

(72) Inventors: Soo Chul Lim, Seoul (KR); Joon Ah Park, Hwaseong-si (KR); Sang Hun Jeon, Seoul (KR); Jong Jin Park, Hwaseong-si (KR); Jung Kyun Im, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 101 days.

(21) Appl. No.: 14/077,731

(22) Filed: Nov. 12, 2013

(65) Prior Publication Data

US 2014/0150572 A1    Jun. 5, 2014

(30) Foreign Application Priority Data

Dec. 5, 2012 (KR) .................. 10-2012-0140032

(51) Int. Cl.
*G01L 1/12* (2006.01)
*G01L 1/14* (2006.01)
*G06F 3/0338* (2013.01)
*G01L 9/00* (2006.01)

(52) U.S. Cl.
CPC .............. *G01L 1/142* (2013.01); *G06F 3/0338* (2013.01); *G01L 9/0072* (2013.01)

(58) Field of Classification Search
CPC ...... G06F 3/0338; G01L 1/142; G01L 9/0072
USPC .............................. 73/780, 862.391, 862.626
See application file for complete search history.

(56) References Cited

U.S. PATENT DOCUMENTS

| | | | | |
|---|---|---|---|---|
| 5,010,772 A | * | 4/1991 | Bourland et al. | 73/862.046 |
| 5,111,004 A | | 5/1992 | Gullman | |
| 6,006,386 A | * | 12/1999 | Mohaupt | 73/862.68 |
| 6,232,717 B1 | * | 5/2001 | Oida et al. | 313/586 |
| 7,020,972 B2 | * | 4/2006 | Graf et al. | 33/501.7 |
| 7,707,001 B2 | | 4/2010 | Obinata et al. | |
| 8,405,525 B2 | * | 3/2013 | Wang et al. | 341/20 |
| 2009/0224646 A1 | * | 9/2009 | Kim et al. | 313/245 |
| 2010/0097300 A1 | * | 4/2010 | Yim | 345/60 |
| 2012/0188204 A1 | * | 7/2012 | Yeo et al. | 345/175 |

FOREIGN PATENT DOCUMENTS

| | | |
|---|---|---|
| KR | 10-2006-0021171 | 3/2006 |
| KR | 2006-64465 | 3/2006 |
| KR | 10-2006-0101029 | 9/2006 |
| KR | 10-2006-0103793 | 10/2006 |
| KR | 10-2006-01311787 | 12/2006 |
| KR | 10-2007-0019204 | 2/2007 |
| KR | 10-2007-0036015 | 4/2007 |
| KR | 10-2012-0055722 | 5/2012 |

* cited by examiner

*Primary Examiner* — Max Noori
(74) *Attorney, Agent, or Firm* — NSIP Law

(57) ABSTRACT

A tactile sensor includes a first substrate including a plurality of first electrodes, a second substrate including a plurality of second electrodes corresponding to the plurality of first electrodes, and a dielectric substance disposed between the first substrate and the second substrate, wherein a second electrode corresponding to any one of the first electrodes is offset in one direction with respect to the any one of the first electrodes while a second electrode corresponding to another first electrode neighboring the any one of the first electrodes is offset in another direction.

54 Claims, 15 Drawing Sheets

TACTILE SENSOR

CROSS-REFERENCE TO RELATED APPLICATIONS

This application claims the priority benefit of Korean Patent Application No. 10-2012-0140032, filed on Dec. 5, 2012, in the Korean Intellectual Property Office, the disclosure of which is incorporated herein by reference.

BACKGROUND

1. Field

One or more example embodiments of the following description relate to a tactile sensor.

2. Description of the Related Art

Tactile sensing refers to a technology for sensing and providing physical characteristics of an object or an environment in a contacting or tactile manner.

SUMMARY

According to one or more example embodiments, there may be provided a tactile sensor including a first substrate including a plurality of first electrodes; a second substrate including a plurality of second electrodes corresponding to the plurality of first electrodes; and a dielectric substance disposed between the first substrate and the second substrate, wherein a second electrode corresponding to any one of the first electrodes is offset or separated from the any one first electrode in one direction while a second electrode corresponding to another first electrode neighboring the any one first electrode is separated from the another first electrode in another direction.

The any one of the first electrodes and the second electrode corresponding to the any one first electrode may be line symmetrical to the another first electrode and the second electrode corresponding to the another first electrode.

The first electrodes and the second electrodes corresponding to each other may only partially overlap when the first substrate and the second substrate are seen from above.

A capacitance between at least part of the first electrodes and second electrodes corresponding to the at least part of the first electrodes may increase or decrease when a shearing force is applied to the first substrate in a first direction, and the capacitance between the at least part of the first electrodes and the corresponding second electrodes may decrease or increase when a shearing force is applied to the first substrate in an opposite direction to the first direction.

A capacitance between at least another part of the first electrodes, other than the at least part of the first electrodes, and second electrodes corresponding to the at least another part of the first electrodes may decrease or increase when a shearing force is applied to the first substrate in the first direction, and the capacitance between the at least another part of the first electrodes and the corresponding second electrodes may increase or decrease when a shearing force is applied to the first substrate in the opposite direction to the first direction.

The first substrate may be moved horizontally and vertically with respect to the second substrate when a force is applied to the first substrate, and magnitude and direction of the shearing force applied to the first substrate may be measured using a change in an overlapping area between the first electrodes and the second electrodes, and magnitude of a vertical force applied to the first substrate is measured using a change in a distance between the first electrodes and the second electrodes.

At least four of the first electrodes and at least four of the second electrodes corresponding to the at least four first electrodes may form one unit set, the at least four first electrodes and the at least four second electrodes included in the unit set may be separated by predetermined intervals, and the at least four first electrodes included in the unit set may be arranged broader, that is separated a greater distance from each other, than the at least four second electrodes included in the unit set so that an inner side of the at least four first electrodes overlaps with an outer side of the at least four second electrodes.

The one unit set may include four first electrodes and four second electrodes corresponding to the four first electrodes, the four first electrodes and the four second electrodes arranged to respectively form vertices of an imaginary rectangle, and the four first electrodes may be disposed at a longer distance than the four second electrodes from a center of the imaginary rectangle.

A capacitance between at least part of the first electrodes and second electrodes corresponding to the at least part of the first electrodes may increase when a vertical force is applied to the first substrate or the second substrate.

The dielectric substance may be extensible and compressible.

The dielectric substance may be a compound comprising silicone or polymer.

A portion of the dielectric substance, the portion not overlapping with the first electrodes or the second electrodes, may be formed as a cavity.

The dielectric substance may include an air path depressed to allow passage of airflow or flow of air.

The first electrodes and the second electrodes may be made of graphene.

According to one or more example embodiments, there may be also provided a tactile sensor including a first substrate including a plurality of first electrodes, a second substrate including a plurality of second electrodes corresponding to the plurality of first electrodes, and a dielectric substance disposed between the first substrate and the second substrate, wherein the first electrodes and the second electrodes are alternately arranged to only partially overlap each other, a capacitance between at least part of the first electrodes and second electrodes corresponding to the at least part of the first electrodes may increase or decrease when a shearing force is applied to the first substrate in a first direction, and the capacitance between the at least part of the first electrodes and the corresponding to second electrodes is changed in an opposite manner to when the shearing force is applied to the first substrate in the first direction, when a shearing force is applied to the first substrate in an opposite direction to the first direction.

A capacitance between at least another part of the first electrodes, other than the at least part of the first electrodes, and second electrodes corresponding to the at least another part of the first electrodes may increase or decrease when a shearing force is applied to the first substrate in the first direction, and the capacitance between the at least another part of the first electrodes and the corresponding second electrodes may change in the opposite manner to when the shearing force is applied to the first substrate in the first direction, when a shearing force is applied to the first substrate in the opposite direction to the first direction.

At least four of the first electrodes and at least four of the second electrodes corresponding to the at least four first electrodes may form one unit set, the at least four first electrodes and the at least four second electrodes included in the unit set may be separated by predetermined intervals, and the at least four first electrodes included in the unit set may be arranged broader than the at least four second electrodes included in the unit set so that an inner side of the at least four first electrodes overlaps with an outer side of the at least four second electrodes.

The one unit set may include four first electrodes and four second electrodes corresponding to the four first electrodes, the four first electrodes and the four second electrodes arranged to respectively form vertices of an imaginary rectangle, and the four first electrodes may be disposed at a longer distance than the four second electrodes from a center of the imaginary rectangle.

The capacitance between at least part of the first electrodes and second electrodes corresponding to the at least part of the first electrodes may increase when a vertical force is applied to the first substrate or the second substrate.

The dielectric substance may be extensible and compressible.

The dielectric substance may be a compound comprising silicone or polymer.

A portion of the dielectric substance, the portion not overlapping with the first electrodes or the second electrodes, may be formed as a cavity.

The first electrodes and the second electrodes may be made of graphene.

According to one or more example embodiments, there may be also provided a sensor including a first substrate including four first electrodes; and a second substrate including four second electrodes which only partially overlap with the four first electrodes by respectively different regions, the second substrate being separated from the first substrate.

A second electrode only partially overlapping with any one of the four first electrodes may be separated from the any one first electrode in one direction while a second electrode only partially overlapping with another first electrode neighboring the any one first electrode is separated from the another first electrode in another direction.

The second electrode overlapping wholly or partially with any one of the four first electrodes may be line symmetrical to the second electrode overlapping wholly or partially with the another first electrode neighboring the any one first electrode.

A capacitance between at least part of the four first electrodes and second electrodes only partially overlapping with the at least part of the four first electrodes may increase or decrease when a shearing force is applied to the first substrate in the first direction, and the capacitance between the at least part of the four first electrodes and the second electrodes only partially overlapping with the at least part of the four first electrodes may decrease or increase when a shearing force is applied to the first substrate in an opposite direction to the first direction.

The capacitance between the at least another part of the first electrodes, other than the at least part of the first electrodes, and second electrodes corresponding to the at least another part of the first electrodes may decrease or increase when the shearing force is applied to the first substrate in the first direction, and the capacitance between the at least another part of the first electrodes and the corresponding second electrodes may increase or decrease when the shearing force is applied to the first substrate in the opposite direction to the first direction.

The first substrate may be moved horizontally and vertically with respect to the second substrate when a force is applied to the first substrate, and magnitude and direction of the shearing force applied to the first substrate may be measured using a change in an overlapping area between the first electrodes and the second electrodes, and magnitude of a vertical force applied to the first substrate may be measured using a change in a distance between the first electrodes and the second electrodes.

The four first electrodes and the four second electrodes may be separated by predetermined intervals, and the four first electrodes may be arranged broader than the four second electrodes so that an inner side of the four first electrodes overlaps with an outer side of the four second electrodes.

The four first electrodes and the four second electrodes may be arranged to form four vertices of an imaginary rectangle, respectively, and the four first electrodes may be disposed at a longer distance than the four second electrodes from a center of the imaginary rectangle.

A capacitance between at least part of the four first electrodes and second electrodes corresponding to the at least part of the four first electrodes may increase when a vertical force is applied to the first substrate or the second substrate.

A dielectric substance may be disposed between the first substrate and the second substrate and the dielectric substance is extensible and compressible.

The dielectric substance may be a compound comprising silicone or polymer.

A portion of the dielectric substance, the portion not overlapping with the four first electrodes or the four second electrodes, may be formed as a cavity.

The dielectric substance may include an air path depressed to allow passage of airflow or flow of air.

The four first electrodes and the four second electrodes may be made of graphene.

According to one more example embodiments, there may be also provided a sensor including a first substrate including four first electrodes; and a second substrate separated from the first substrate, the second substrate including four second electrodes which only partially overlap with the four first electrodes and are arranged broader than the four first electrodes.

A second electrode only partially overlapping with any one of the four first electrodes may be separated from the any one first electrode in one direction while a second electrode only partially overlapping with another first electrode neighboring the any one of the first electrodes is separated from the another first electrode in another direction.

Any one of the four first electrodes and a second electrode only partially overlapping with the any one first electrode may be line symmetrical to another first electrode neighboring the any one first electrode and a second electrode only partially overlapping with the another first electrode.

A capacitance between at least part of the four first electrodes and second electrodes only partially overlapping with the at least part of the four first electrodes may increase or decrease when a shearing force is applied to the first substrate in the first direction, and the capacitance between the at least part of the four first electrodes and the second electrodes only partially overlapping with the at least part of the four first electrodes may decrease or increase when a shearing force is applied to the first substrate in an opposite direction to the first direction.

The capacitance between at least another part of the first electrodes, other than the at least part of the first electrodes, and second electrodes corresponding to the at least another part of the first electrodes may decrease or increase when a shearing force is applied to the first substrate in the first direction, and the capacitance between the at least another part of the first electrodes and the corresponding second electrodes may increase or decrease when the shearing force is applied to the first substrate in the opposite direction to the first direction.

The first substrate may be moved horizontally and vertically with respect to the second substrate when a force is applied to the first substrate, magnitude and direction of the shearing force applied to the first substrate may be measured using a change in an overlapping area between the first electrodes and the second electrodes, and magnitude of a vertical force applied to the first substrate may be measured using a change in a distance between the first electrodes and the second electrodes.

An outer side of the four first electrodes and an inner side of the four second electrodes may overlap with each other.

The four first electrodes and the four second electrodes may be arranged to form four vertices of an imaginary rectangle, respectively, and the four first electrodes may be disposed at a longer distance than the four second electrodes from a center of the imaginary rectangle.

A capacitance between at least part of the four first electrodes and corresponding second electrodes may increase when a vertical force is applied to the first substrate or the second substrate.

A dielectric substance may be disposed between the first substrate and the second substrate and the dielectric substance may be extensible and compressible.

The dielectric substance may be a compound comprising silicone or polymer.

A portion of the dielectric substance, the portion not overlapping with the first electrodes or the second electrodes, may be formed as a cavity.

The dielectric substance may include an air path depressed to allow passage of airflow.

The four first electrodes and the four second electrodes may be made of graphene.

According to one or more example embodiments, there may be also provided a tactile sensor including an upper substrate including a plurality of first electrodes, a lower substrate including a plurality of second electrodes, and a dielectric disposed between the upper substrate and the lower substrate. The first electrodes and the second electrodes include a first group including first electrodes and corresponding second electrodes wherein each first electrode of the first group is disposed to be shifted in a first direction with respect to each of the corresponding second electrodes while still partially overlapping each of the corresponding second electrodes of the first group by a first predetermined amount and a second group including first electrodes and corresponding second electrodes wherein each first electrode of the second group is disposed to be shifted in a second direction with respect to each of the corresponding second electrodes while still partially overlapping each of the corresponding second electrodes of the second group by a second predetermined amount.

According to one or more example embodiments, there may be also provided a tactile sensor including an upper substrate including a plurality of first electrodes, a lower substrate including a plurality of second electrodes, and a dielectric disposed between the upper substrate and the lower substrate. The first electrodes and the second electrodes include a first group including first electrodes and corresponding second electrodes each disposed to overlap each other by a first predetermined amount and a second group including first electrodes and corresponding second electrodes each disposed to overlap each other by a second predetermined amount.

According to one or more example embodiments, there may be also provided a tactile sensor including an upper substrate including a plurality of first electrodes, a lower substrate including a plurality of second electrodes, and a dielectric disposed between the upper substrate and the lower substrate. The first electrodes and the second electrodes include a first group including first electrodes and corresponding second electrodes wherein each first electrode of the first group is disposed to overlap each corresponding second electrode of the first group by a first predetermined amount, and a second group including first electrodes and corresponding second electrodes wherein each first electrode of the second group is disposed to overlap each corresponding second electrode of the second group by a first predetermined amount.

Additional aspects, features, and/or advantages of example embodiments will be set forth in part in the description which follows and, in part, will be apparent from the description, or may be learned by practice of the disclosure.

BRIEF DESCRIPTION OF THE DRAWINGS

These and/or other aspects and advantages will become apparent and more readily appreciated from the following description of the example embodiments, taken in conjunction with the accompanying drawings of which.

DETAILED DESCRIPTION

Figure 1:
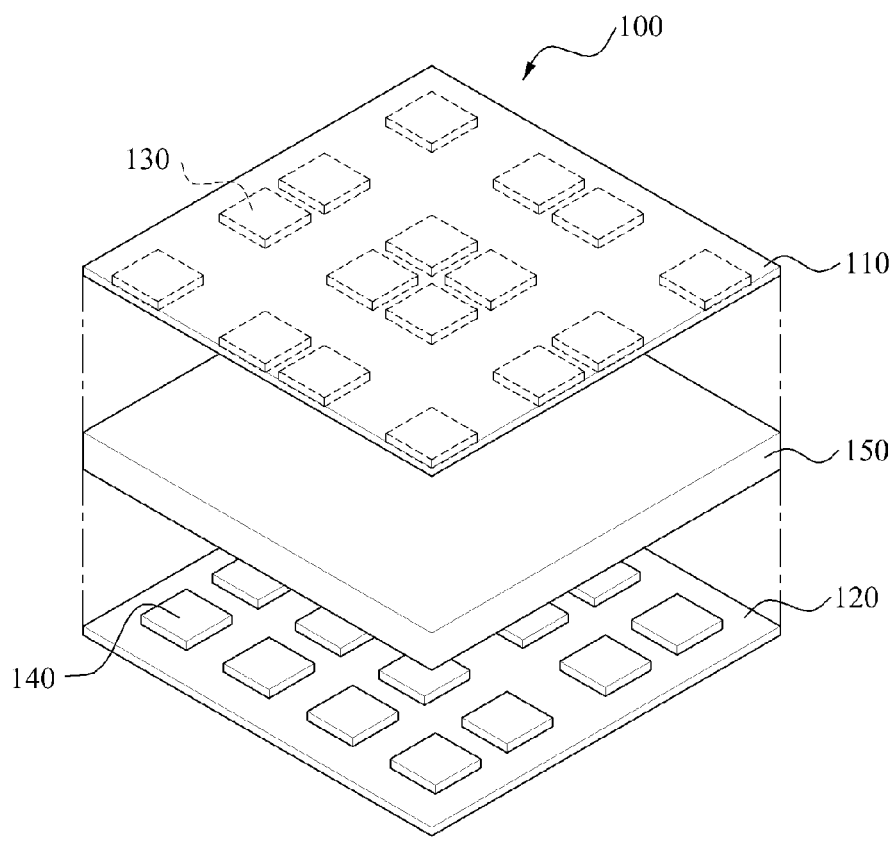
FIG. 1 illustrates an exploded perspective view of a tactile sensor according to example embodiments.

Reference will now be made in detail to example embodiments, examples of which are illustrated in the accompanying drawings, wherein like reference numerals refer to the like elements throughout.

Figure 2:
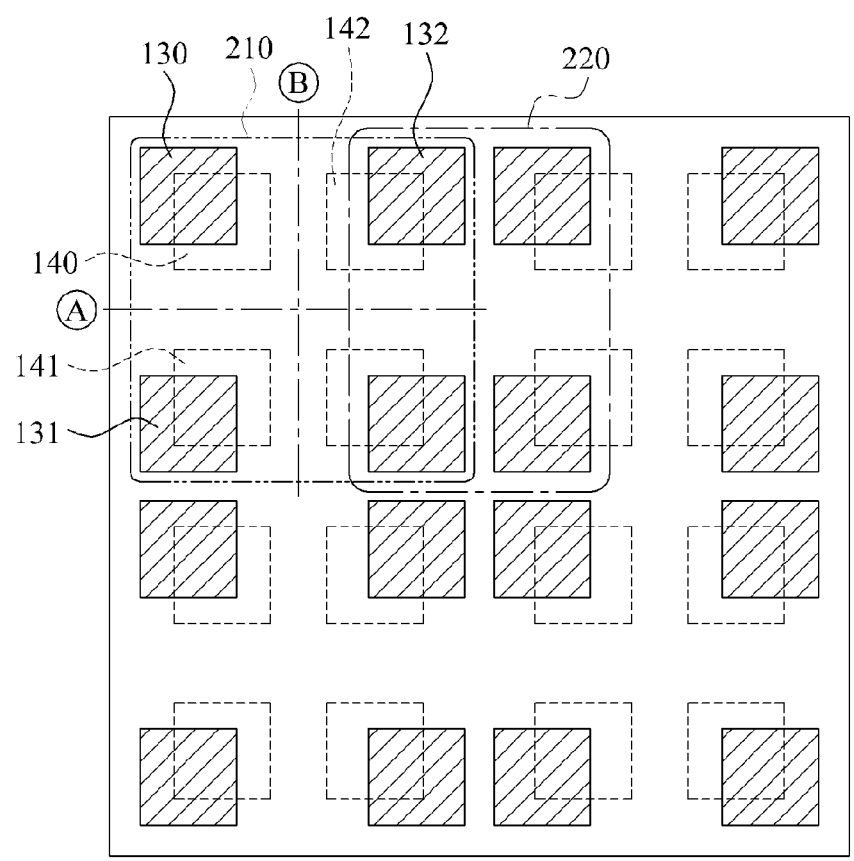
FIG. 2 illustrates a plan view of the tactile sensor of FIG. 1.

FIG. 1 illustrates an exploded perspective view of a tactile sensor 100 according to example embodiments. FIG. 2 illustrates a plan view of the tactile sensor 100 and FIG. 3 illustrates a sectional view of the tactile sensor 100.

Figure 3:
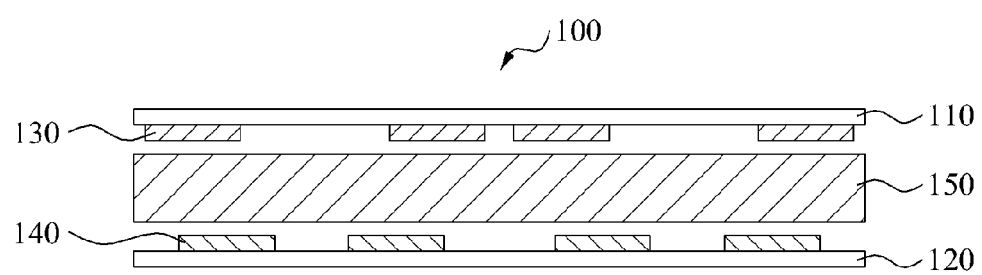
FIG. 3 illustrates a sectional view of the tactile sensor of FIG. 1.

Referring to FIGS. 1 to 3, the tactile sensor 100 may include, for example, an upper substrate 110, a lower substrate 120, a first electrode 130 provided to the upper substrate 110, a second electrode 140 provided to the lower substrate 120, and a dielectric substance 150 disposed between the upper substrate 110 and the second substrate 120.

The upper substrate 110 may be provided in a flat plate form to form an upper surface of the tactile sensor 110. The lower substrate 120 may form a lower surface of the tactile sensor 100 and may also be provided in a flat plate form. The upper substrate 110 and the lower substrate 120 may be made of polyimide having an excellent electrical characteristic but this is not limiting. Electrical wiring may be installed at the upper substrate 110 and the lower substrate 120. The electrical wiring may be connected to an external power supply (not shown) so that power is supplied to the first electrode 130 and the second electrode 140.

A plurality of the first electrodes 130 may be attached to the upper substrate 110. A plurality of the second electrodes 140 may be attached to the lower substrate 120. In FIG. 1, the first electrodes 130 and the second electrodes 140 are in a flat rectangular shape. However, the shape of the first electrodes 130 and the second electrodes 140 is not limited to the rectangular shape but may alternatively be any other flat shape. The first electrodes 130 and the second electrodes 140 may be made of a generally known material for an electrode, for example, graphene. The plurality of the first electrodes 130 may be connected to the upper substrate 110 and may be separated from each other by predetermined intervals. When the external power supply is connected to the first electrodes 130 and the second electrodes 140, opposite electrical polarities are applied to the first electrodes 130 and the second electrodes 140. For example, when a positive polarity is applied to the first electrodes 130, a negative polarity may be applied to the second electrodes 140. Conversely, when a negative polarity is applied to the first electrodes 130, a positive polarity may be applied to the second electrodes 140.

The plurality of first electrodes 130 may correspond to the plurality of second electrodes 140, respectively. That is, the plurality of first electrodes 130 may match the plurality of second electrodes 140 on a one-to-one basis. In other words, for each first electrode 130 there is a matching or corresponding second electrode 140. Here, the second electrodes 140 corresponding to the first electrodes 130 may be disposed to face at least part of the first electrodes 130 when the upper substrate 110 covers an upper portion of the lower substrate 120. That is to say, the second electrodes 140 corresponding to the first electrodes 130 may be disposed so that at least a portion of each second electrode overlaps with a portion of a corresponding first electrode 130.

When a shearing force is applied to the upper substrate 110, the first electrodes 130 may be moved in a direction of the shearing force with respect to the second electrodes 140 that correspond to the first electrodes 130. For example, when the shearing force is applied rightward to the upper substrate 110, the first electrodes 130 may be moved to the right with respect to the corresponding second electrodes 140. When the shearing force is applied leftward to the upper substrate 110, the first electrodes 130 may be moved to the left with respect to the corresponding second electrodes 140. Accordingly, when the shearing force is applied to the upper substrate 110 or the lower substrate 120, an area by which the first electrodes 130 and the second electrodes 140 face each other may be increased or decreased. That is to say, a portion of a first electrode 130 that overlaps with a corresponding second electrode 140 may change.

The first electrodes 130 and the second electrodes 140 partially face each other and opposite polarities are applied to the first electrodes 130 and the second electrodes 140. Therefore, an electric field may be generated in a space between the first electrodes 130 and the second electrodes 140. Charges may be accumulated at the first electrodes 130 and the second electrode 140 in a manner similar to a capacitor.

The dielectric substance 150 may be disposed between the upper substrate 110 and the lower substrate 120. In detail, the dielectric substance 150 may be disposed between the first electrodes 130 and the second electrodes 140. When the electric field is applied to the dielectric substance 150, electric polarization may occur at the dielectric substance 150 but a direct current is not generated. The dielectric substance 150 may be substantially in a parallelepiped shape such as a rectangular parallelepiped shape to be disposed between the upper substrate 110 and the lower substrate 120. The dielectric substance 150 may have a surface area greater than or equal to surface areas of the upper substrate 110 and the lower substrate 120. The dielectric substance 150 may include a material having a high dielectric constant that is easily extended and compressed. For example, the dielectric substance 150 may be a compound including silicone or a polymer. Since the dielectric substance 150 is made of an extensible and compressible material, when a vertical force is applied to the upper substrate 110 or the lower substrate 120, the dielectric substance 150 may be compressed and then may return to an original shape.

When ∈ denotes a dielectric constant of the dielectric substance 150, a capacitance C between the first electrode 130 and the corresponding second electrode 140 may be expressed as follows.

$$C = \varepsilon \frac{A}{d}$$

Here, ∈ denotes the dielectric constant of the dielectric substance 150, A denotes an area by which the first electrode 130 and the corresponding second electrode 140 face or overlap each other, and d denotes a distance between the first electrode 130 and the second electrode 140. When a shearing force is applied to the upper substrate 110 or the lower electrode 120, and therefore the area A by which the first electrode 130 and the corresponding second electrode 140 face is reduced, the capacitance between the first electrode 130 and the second electrode 140 may be reduced. When the area A is increased, the capacitance between the first electrode 130 and the second electrode 140 may be increased. When a vertical force is applied to the upper substrate 110 or the lower substrate 120, thereby compressing the dielectric substance 150 and reducing the distance d between the first electrode 130 and the corresponding second electrode 140. Accordingly, the capacitance between the first electrode 130 and the corresponding second electrode 140 may be increased. Thus, in an embodiment, a horizontal force including a shear force and a vertical force may be simultaneously measured.

Each of the first electrodes 130 and the second electrodes 140 may include a capacitance meter (not shown) adapted to measure capacitance between the first electrodes 130 and the second electrodes 140. When a shearing force is applied in a horizontal direction to the upper substrate 110 or to the lower substrate 120, to detect a change in the capacitance between the first electrodes 130 and the second electrodes 140 and measure the direction of the shearing force, the first electrodes 130 and the corresponding second electrodes 140 need to only partially overlap when seen from above the upper substrate 110 as shown in FIG. 2. When the first electrodes 130 and the second electrodes 140 are perspectively seen from above, the upper substrate 110 as shown in FIG. 2, the first electrodes 130 and the corresponding second electrodes 140 may be arranged alternately to only partially overlap with each other.

When the first electrodes 130 and the corresponding second electrodes 140 completely overlap and when the shearing force is applied to the upper substrate 110, the area A by which the first electrodes 130 and the corresponding second electrodes 140 overlap is reduced regardless of a moving direction of the first electrodes 130 That is, when the first electrodes 130 and the corresponding second electrodes 140 have perimeters that are completely aligned with each other and when the shearing force is applied to the upper substrate 110, the area A by which the first electrodes 130 and the corresponding second electrodes 140 will be reduced regardless of a the direction of movement of the first electrodes 130. Therefore, the direction of the shearing force applied to the upper substrate 110 may not be measured since the capacitance between the first electrodes 130 and the second electrodes 140 due to the shearing force may change similarly regardless of the moving direction of the first electrodes 130. In addition, when the first electrodes 130 and the corresponding second electrodes 140 completely overlap, the shearing force may be applied to the upper substrate 110 and the area A between the first electrodes 130 and the overlap of the corresponding second electrodes 140 may be reduced regardless of whether the first electrodes 130 are moved to the right or the left. Therefore, the capacitance between the first electrodes 130 and the corresponding second electrodes 140 may be reduced. As a result, the direction of the shearing force applied to the upper substrate 110 may not be detected.

At least four pairs of the first electrodes 130 and second electrodes 140 may be provided to distinguish at least four directions, that is, upper, lower, right, and left directions, of the shearing force applied to a predetermined area of the upper substrate 110. Referring to FIG. 2, as aforementioned, a first area 210 of the upper substrate 110 includes four pairs of the first electrodes 130 and corresponding second electrodes 140. The four first electrodes 130 and the four second electrodes 140 corresponding to the four first electrodes 130 included in the first area 210 may be disposed to be separated from each other by a predetermined interval. The four first electrodes 130 may be separated from each other a greater distance than the four second electrodes 140. Therefore, inner vertices of the four first electrodes 130 included in the first area 210 and outer vertices of the four second electrodes 140 included in the first area 210 may be overlapped as illustrated in FIG. 2.

With respect to a first electrode 130, a corresponding second electrode 140 may be separated in a predetermined direction. With respect to another first electrode 131 neighboring the first electrode 130, another corresponding second electrode 141 may be separated in a direction opposite of the predetermined direction.

According to this, when the shearing force is applied to the first area 210 leftward, the upper substrate 110 may be moved to the left with respect to the lower substrate 120. Therefore, a capacitance between the first electrode 131 and the second electrode 141 may be reduced. When the shearing force is applied to the first area 210 rightward, the capacitance between the first electrode 130 and the second electrode 140 and the capacitance between the first electrode 131 and the second electrode 141 may be increased. That is, when the shearing force is applied to the first area 210 leftward or rightward, the capacitance between the first electrode 130 and the second electrode 140 may be increased or decreased in the same manner as the capacitance between the first electrode 131 and the second electrode 141 disposed at a lower left position.

When the shearing force is applied to the first area 210 upward, the capacitance between the first electrode 130 and the second electrode 140 disposed at an upper left position of the first area 210 may be decreased whereas the capacitance between the first electrode 131 and the second electrode 141 disposed at the lower left position may be increased. Conversely, when the shearing force is applied to the first area 210 downward, the capacitance between the first electrode 130 and the second electrode 140 disposed at the upper left position may be increased whereas the capacitance between the first electrode 131 and the second electrode 141 disposed at the lower left position may be decreased. That is, when the shearing force is applied upward or downward, the capacitance between the first electrode 130 and the second electrode 140 disposed in the upper left position may be increased or decreased in the opposite manner to the capacitance between the first electrode 131 and the second electrode 141 disposed in the lower left position. Thus, according to whether the shearing force is applied horizontally or vertically in the predetermined area, the capacitance between the neighboring first electrodes and the corresponding second electrodes may be increased and decreased in the same manner or in the opposite manner. This is because, when the second electrode is separated in the predetermined direction with respect to the corresponding first electrode, the neighboring second electrode is separated in the opposite direction with respect to the corresponding first electrode. For example, referring to FIG. 2, the second electrode 140 corresponding to the first electrode 130 is separated downward from the first electrode 130. The second electrode 141 corresponding to the first electrode 131 is separated in the opposite direction, that is, upward, from the first electrode 131.

In a similar manner, the second electrode 140 corresponding to the first electrode 130 may be separated to the right with respect to the first electrode 130. A second electrode 142 corresponding to a first electrode 132 neighboring the first electrode 130 may be separated in the opposite direction, that is, to the left, with respect to the first electrode 132.

When the shearing force is applied to the first area 210 downward, the capacitance between the first electrode 130 and the second electrode 140 disposed at the upper left position and the first electrode 132 and the second electrode 142 disposed at an upper right position may be increased. When the shearing force is applied to the first area 210 upward, the capacitance between the first electrode 130 and the second electrode 140 disposed at the upper left position and the first electrode 132 and the second electrode 142 disposed at the upper right position may be decreased.

That is, when the shearing force is applied to the first area 210 downward and upward, the capacitance between the first electrode 130 and the second electrode 140 disposed at the upper left position may be increased and decreased in the same manner as the capacitance between the first electrode 132 and the second electrode 142 disposed at the upper right position.

When the shearing force is applied to the first area 210 leftward, the capacitance between the first electrode 130 and the second electrode 140 disposed at the upper left position may be decreased while the capacitance between the first electrode 132 and the second electrode 142 disposed at the upper right position may be increased.

Conversely, when the shearing force is applied to the first area 210 rightward, the capacitance between the first electrode 130 and the second electrode 140 disposed at the upper left position may be increased while the capacitance between the first electrode 132 and the second electrode 142 disposed at the upper right position may be decreased.

That is, when the shearing force is applied to the first area 210 leftward and rightward, the capacitance between the first electrode 130 and the second electrode 140 disposed at the upper left position may be increased and decreased in the opposite manner to the capacitance between the first electrode 132 and the second electrode 142 disposed at the upper right position.

With respect to the first electrode 130 and the second electrode 140 disposed at the upper left position of the first area 210 and a first electrode 132 and a corresponding second electrode 142 disposed at the upper right position, the capacitance between the neighboring first electrodes and the corresponding second electrodes may be increased and decreased in the same manner or the opposite manner according to whether the shearing force is applied horizontally and vertically in the predetermined area. Thus, the first area 210 of the upper substrate 110 includes at least four first electrodes and corresponding four second electrodes, and the four pairs of first electrodes and corresponding second electrodes and the neighboring first electrodes and second electrodes are disposed such that relative positions of the lower substrate with respect to the upper substrate are opposite. Therefore, four different combinations of increase and decrease in the capacitance, the combinations for distinguishing upward, downward, leftward, and rightward directions of the shearing force, may be achieved.

The foregoing configuration in which the at least four pairs of first electrodes and corresponding second electrodes of the first area 210 and the neighboring first electrodes and second electrodes are disposed such that relative positions of the lower substrate with respect to the upper substrate are opposite to distinguish the direction of a force may be also applied to a second area 220 of the upper substrate 110. The first area 210 and the second area 220 may form one unit set for distinguishing upper, lower, left, and right directions in the tactile sensor 100.

To distinguish the directions of the shearing force applied to the first area 210 at least into upper, lower, left, and right directions, the first electrodes 130 and the corresponding second electrodes 140 may be disposed symmetrically to the first electrode 131 and the corresponding second electrodes 141 neighboring the first electrode 130 and the second electrode 140, respectively, with respect to an imaginary straight line A. That is, the neighboring first electrodes and the corresponding second electrodes are arranged in a decalcomania type with reference to the imaginary line. In a similar manner, the first electrode 130 and the second electrode 140 dispose at the upper left position may be disposed symmetrically to the first electrode 132 and the corresponding second electrodes 142 neighboring the first electrode 130 and the second electrode 140, with respect to an imaginary straight line B. To generate four different combinations of increase and decrease in the capacitance, the combinations for distinguishing upward, downward, leftward, and rightward directions of the shearing force applied to the upper substrate 110 or the lower substrate 120, the first electrode and the corresponding second electrode must be line symmetrical to the neighboring first electrodes and second electrodes.

When the first electrode and the corresponding second electrode are line symmetrical to the neighboring first electrodes and second electrodes, an increased or decreased amount of the capacitance may be equal in one unit set. However, although the first electrode and the corresponding second electrode are not line symmetrical to the neighboring first electrodes and second electrodes, when the first electrode and the corresponding second electrode and the neighboring first electrode and second electrode are arranged such that relative positions of the lower substrate with respect to the upper substrate are opposite, the four different combinations of increase and decrease in the capacitance, the combinations for distinguishing upward, downward, leftward, and rightward directions of the shearing force applied to the upper substrate 110 or the lower substrate 120, may be achieved.

The embodiments for forming the four different combinations for distinguishing the upper, lower, left, and right directions of the shearing force will be described later below with reference to FIGS. 11 to 15.

Figure 4:
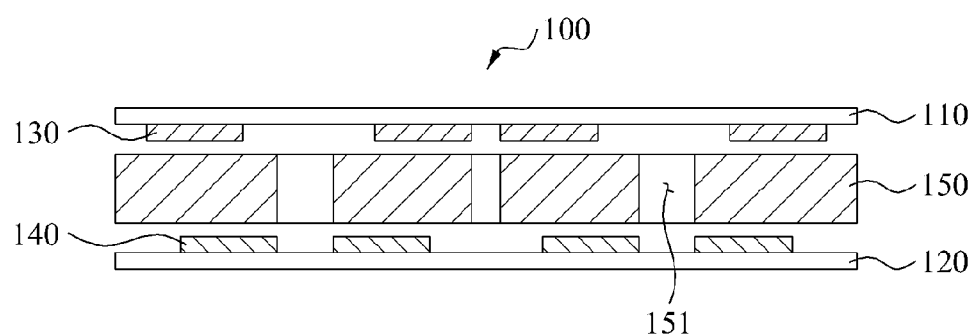
FIG. 4 illustrates a sectional view of a tactile sensor according to other example embodiments.

FIG. 4 illustrates a sectional view of a tactile sensor according to other example embodiments.

Referring to FIG. 4, a cavity 151 in the form of an empty space may be formed in the dielectric substance 150. In detail, the cavity 151 may be disposed at a position in which the first electrode 130 and the second electrode 140 do not overlap, that is, do not face each other.

At a position in which the first electrode 130 and the second electrode 140 overlap, the dielectric substance 150 may be necessary to increase permittivity and accordingly increase the capacitance. Therefore, exemplarily, the cavity 151 may be disposed in the position in which the first electrode 130 and the second electrode 140 do not overlap.

Due to the presence of the cavity 151, the dielectric substance 150 may be largely extended or compressed even by a minor degree of the shearing force or the vertical force applied to the upper substrate 110 or to the lower substrate 120. Consequently, sensitivity of the tactile sensor 100 with respect to an external force may be increased.

Figure 5:
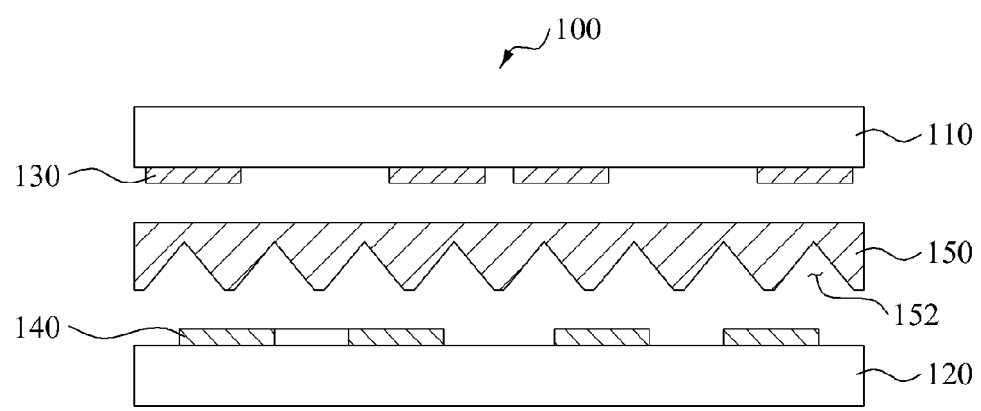
FIG. 5 illustrates a sectional view of a tactile sensor according to yet other example embodiments.

FIG. 5 illustrates a sectional view of a tactile sensor according to yet other example embodiments.

Referring to FIG. 5, the dielectric substance 150 may include a plurality of air paths 152 provided in various shapes. In detail, the air paths 152 may be formed by depressing part of an upper surface or a lower surface of the dielectric substance 150. The air paths 152 may extend in a length direction of the dielectric substance 150.

In FIG. 5, a cross section of the air paths 152 is shown as a V shape. However, the cross section of the air paths 152 is not specifically limited to the V shape but rather may be in various shapes.

The air paths 152 may provide a path allowing passage of airflow. External air of the tactile sensor 100 may flow into the air paths 152. Conversely, internal air of the tactile sensor 100 may flow out through the air paths 152.

Due to the presence of the air paths 152, when the shearing force or the vertical force is applied to the upper substrate 110 or the lower substrate 120, the dielectric substance 150 may be largely extended or compressed even by a minor degree of the shearing force or the vertical force, sensitivity of the tactile sensor 100 with respect to the external force may be increased.

Figure 6:
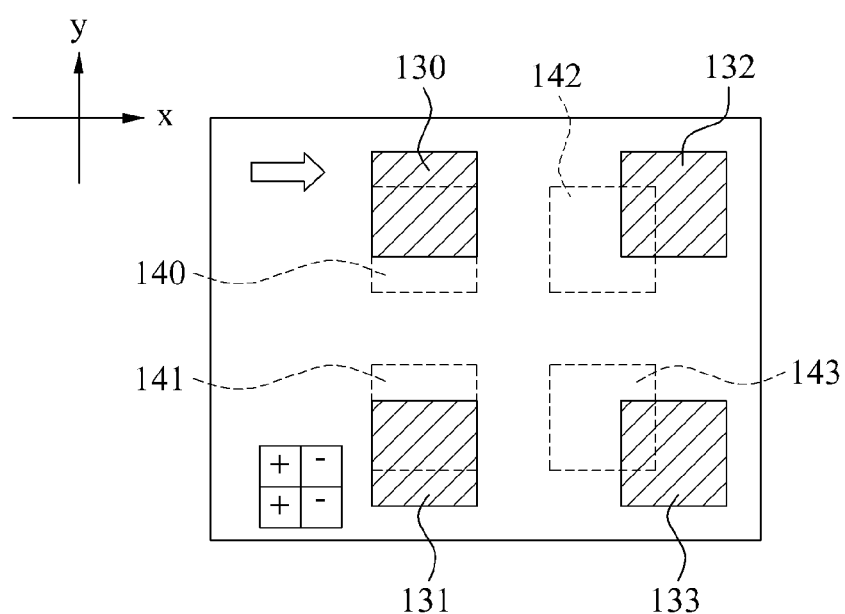
FIG. 6 illustrates variation of a capacitance when a shearing force is applied to a tactile sensor in an x-axis direction, according to example embodiments.
Figure 7:
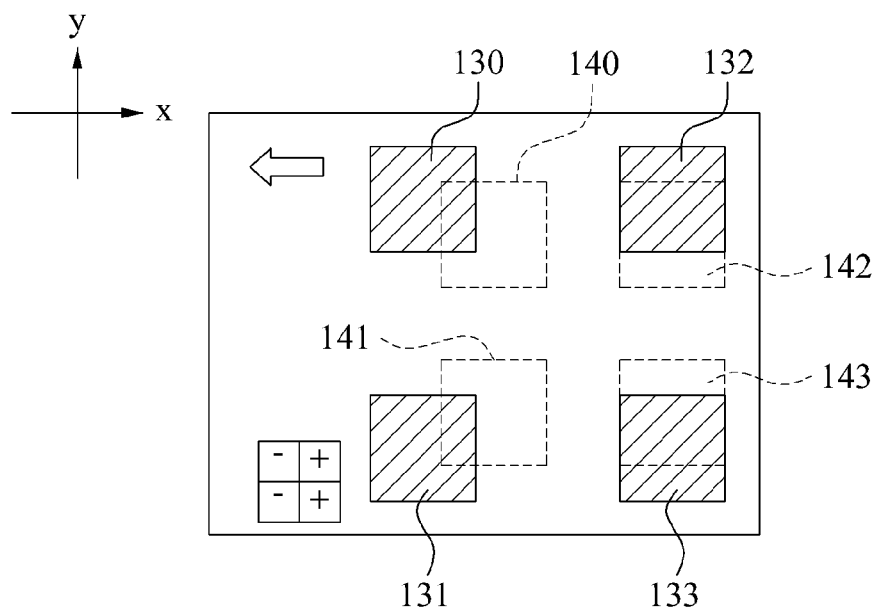
FIG. 7 illustrates variation of a capacitance when a shearing force is applied to a tactile sensor in a negative x-axis direction, according to example embodiments.
Figure 8:
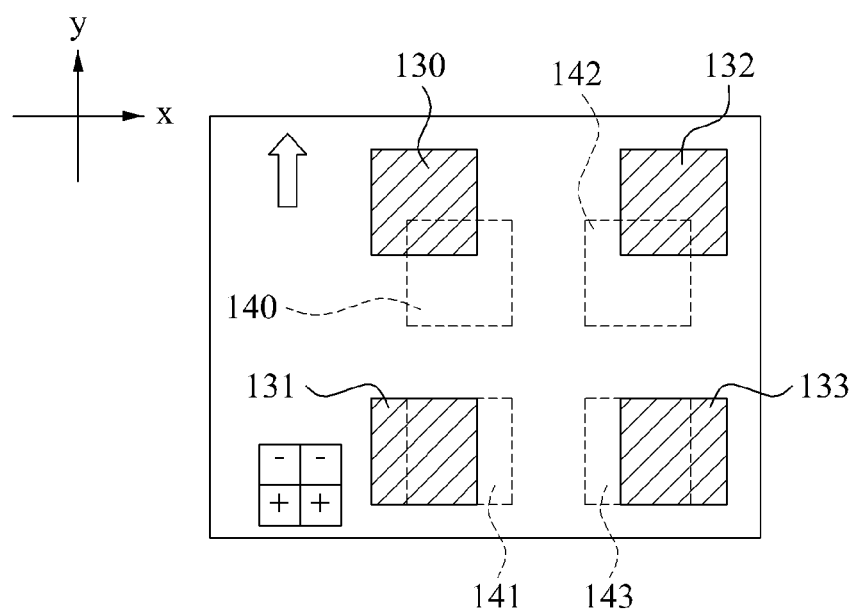
FIG. 8 illustrates variation of a capacitance when a shearing force is applied to a tactile sensor in a y-axis direction, according to example embodiments.
Figure 9:
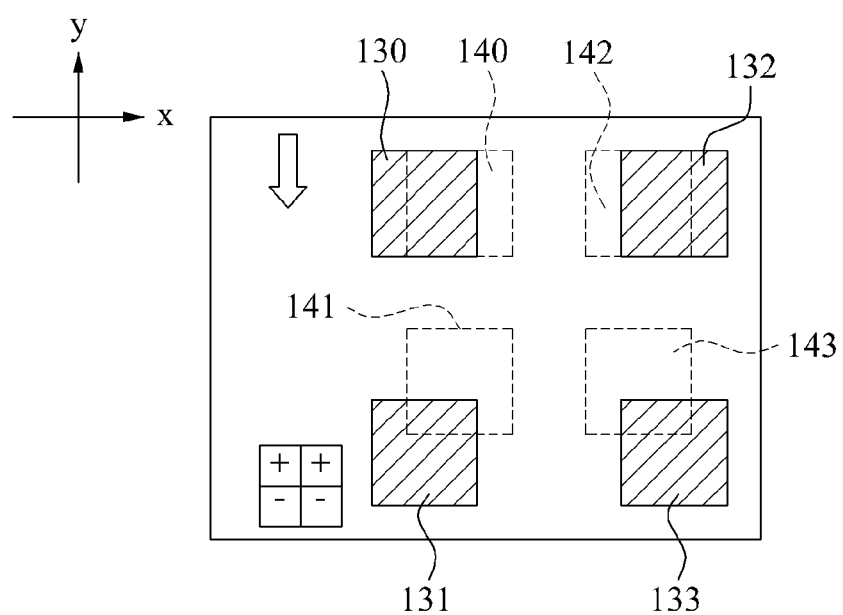
FIG. 9 illustrates variation of a capacitance when a shearing force is applied to a tactile sensor in a negative y-axis direction, according to example embodiments.
Figure 10:
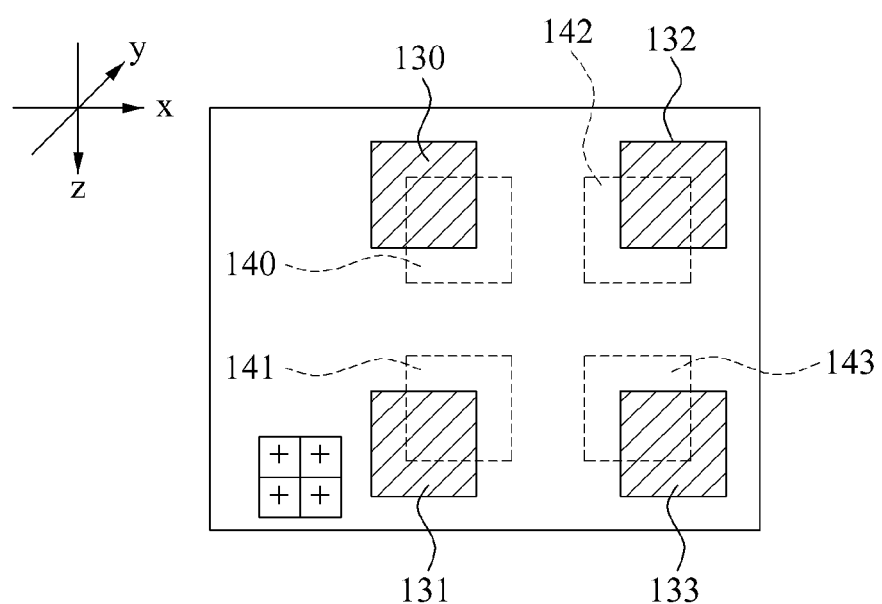
FIG. 10 illustrates variation of a capacitance when a shearing force is applied to a tactile sensor in a z-axis direction, according to example embodiments.

FIG. 6 illustrates variation of a capacitance when a shearing force is applied to a tactile sensor according to example embodiments in an x-axis direction. FIG. 7 illustrates variation of a capacitance when the shearing force is applied to the tactile sensor in a negative x-axis direction. FIG. 8 illustrates variation of a capacitance when the shearing force is applied to the tactile sensor in a y-axis direction. FIG. 9 illustrates variation of a capacitance when the shearing force is applied to the tactile sensor in a negative y-axis direction. FIG. 10 illustrates variation of a capacitance when the shearing force is applied to the tactile sensor in a z-axis direction.

Referring to FIGS. 6 to 10, first, the first electrode 130 and the second electrode 140 are arranged as in the first area 210 of FIG. 2 as an example.

Referring to FIG. 6, for example, when the shearing force is applied to the upper substrate 110 in the x-axis direction, first electrodes connected to the upper substrate 110 may be moved in the x-axis direction, that is, rightward, while the second electrodes connected to the lower substrate 120 remain unmoved. Therefore, an area in which two pairs of the first electrodes 130 and 131 and the corresponding second electrodes 140 and 141, which are disposed at the left position, face each other increases, thereby increasing (+) the capacitances, respectively. As illustrated in FIG. 6, first electrodes 130 and 131 have completed their rightward movement with the result that first electrodes 130 and 131 and second electrodes 140 and 141 are perfectly aligned in the Y-axis, that is, the vertical edges of the first electrode 130 and second electrode 140 are aligned and the vertical edges of the first electrode 131 and the second electrode 141 are aligned. Therefore, the amount of overlapping surface area of the electrodes resulting from movement of the first electrodes 130 and 131 in the x-axis direction is at a maximum. Thus, in the embodiment illustrated in FIG. 6, the first electrodes 130 and 131 have been moved the maximum distance possible in the x-axis direction thereby resulting in the maximum measurable force in the x-axis direction. In addition, since an area in which two pairs of first electrodes 132 and 133 and the corresponding second electrodes 142 and 143, which are disposed at the right position, face each other is decreased, the capacitances may be decreased (−). Thus, in the unit set including four pairs of the first electrodes and second electrodes, when the capacitances of the first electrode 130 and the second electrode 140 disposed at the upper left position and the first electrode 131 and the second electrode 141 disposed at the lower left position are increased, that is, detected to be positive (+), whereas the capacitances of the first electrode 132 and the second electrode 142 disposed at the upper right position and the first electrode 133 and the second electrode 143 disposed at the lower right position are decreased, that is, detected to be negative (−), the tactile sensor 100 may detect the shearing force operated in the x-axis direction, that is, the rightward direction.

Referring to FIG. 7, when the shearing force is applied to the upper substrate 110 in the negative x-axis direction, the first electrodes connected to the upper substrate 110 may be moved in the negative x-axis direction, that is, leftward, while the second electrodes connected to the lower substrate 120 remain unmoved. Therefore, since the area in which two pairs of the first electrodes 132 and 133 and the corresponding second electrodes 142 and 143, which are disposed at the right position, face each other is increased, the capacitances may be increased (+). As illustrated in FIG. 7, first electrodes 132 and 133 have completed their movement in the negative x-axis direction with the result that first electrodes 132 and 133 and second electrodes 142 and 143 are perfectly aligned in the Y-axis, that is, the vertical edges of the first electrode 132 and second electrode 142 are aligned and the vertical edges of the first electrode 133 and the second electrode 143 are aligned. Therefore, the amount of overlapping surface area of the electrodes resulting from movement of the first electrodes 132 and 133 in the negative x-axis direction is at a maximum. Thus, in the embodiment illustrated in FIG. 7, the first electrodes 132 and 133 have been moved the maximum distance possible in the negative x-axis direction thereby resulting in the maximum measurable force in the negative x-axis direction. In addition, since an area in which two pairs of first electrodes 130 and 131 and the corresponding second electrodes 140 and 141, which are disposed at the left position, face each other is decreased, the capacitances may be decreased (−). Thus, in the unit set including four pairs of the first electrodes and second electrodes, when the capacitances of the first electrode 132 and the second electrode 142 disposed at the upper right position and the first electrode 133 and the second electrode 143 disposed at the lower right position are increased, that is, detected to be positive (+), whereas the capacitances of the first electrode 130 and the second electrode 140 disposed at the upper left position and the first electrode 131 and the second electrode 141 disposed at the lower left position are decreased, that is, detected to be negative (−), the tactile sensor 100 may detect the shearing force operated in the negative x-axis direction, that is, the leftward direction.

Referring to FIG. 8, when the shearing force is applied to the upper substrate 110 in the y-axis direction, the first electrodes connected to the upper substrate 110 may be moved in the y-axis direction, that is, upward, while the second electrodes connected to the lower substrate 120 remain unmoved. Therefore, since the area in which two pairs of the first electrodes 131 and 133 and the second electrodes 141 and 143, which are disposed at the lower position, face each other is increased, the capacitances may be increased (+). As illustrated in FIG. 8, first electrodes 131 and 133 have completed their movement in the y-axis direction with the result that first electrodes 131 and 133 and second electrodes 141 and 143 are perfectly aligned in the x-axis, that is, the horizontal edges of the first electrode 131 and second electrode 141 are aligned and the horizontal edges of the first electrode 133 and the second electrode 143 are aligned. Therefore, the amount of overlapping surface area of the electrodes resulting from movement of the first electrodes 131 and 133 in the y-axis direction is at a maximum. Thus, in the embodiment illustrated in FIG. 8, the first electrodes 131 and 133 have been moved the maximum distance possible in the y-axis direction thereby resulting in the maximum measurable force in the y-axis direction. In addition, since an area in which two pairs of the first electrodes 130 and 132 and the corresponding second electrodes 140 and 142, which are disposed at the upper position, face each other is decreased, the capacitances may be decreased (−). Thus, in the unit set including four pairs of the first electrodes and second electrodes, when the capacitances of the first electrode 131 and the second electrode 141 disposed at the lower left position and the first electrode 133 and the second electrode 143 disposed at the lower right position are increased, that is, detected to be positive (+), whereas the capacitances of the first electrode 132 and the second electrode 142 disposed at the upper right position and the first electrode 130 and the second electrode 140 disposed at the upper left position are decreased, that is, detected to be negative (−), the tactile sensor 100 may detect the shearing force operated in the y-axis direction, that is, the upward direction.

Referring to FIG. 9, when the shearing force is applied to the upper substrate 110 in the negative y-axis direction, the first electrodes connected to the upper substrate 110 may be moved in the negative y-axis direction, that is, downward, while the second electrodes connected to the lower substrate 120 remain unmoved. Therefore, since the area in which two pairs of the first electrodes 130 and 132 and the corresponding second electrodes 140 and 142, which are disposed at the upper position, face each other is increased, the capacitances may be increased (+). As illustrated in FIG. 9, first electrodes 130 and 132 have completed their movement in the negative y-axis direction with the result that first electrodes 130 and 132 and second electrodes 140 and 142 are perfectly aligned in the x-axis, that is, the horizontal edges of the first electrode 130 and second electrode 140 are aligned and the horizontal edges of the first electrode 132 and the second electrode 142 are aligned. Therefore, the amount of overlapping surface area of the electrodes resulting from movement of the first electrodes 130 and 132 in the negative y-axis direction is at a maximum. Thus, in the embodiment illustrated in FIG. 9, the first electrodes 130 and 132 have been moved the maximum distance possible in the negative y-axis direction thereby resulting in the maximum measurable force in the negative y-axis direction. In addition, since an area in which two pairs of the first electrodes 131 and 133 and the corresponding second electrodes 141 and 143, which are disposed at the lower position, face each other is decreased, the capacitances may be decreased (−). Thus, in the unit set including four pairs of the first electrodes and second electrodes, when the capacitances of the first electrode 130 and the second electrode 140 disposed at the upper left position and the first electrode 132 and the second electrode 142 disposed at the upper right position are increased, that is, detected to be positive (+), whereas the capacitances of the first electrode 131 and the second electrode 141 disposed at the lower left position and the first electrode 133 and the second electrode 143 disposed at the upper right position are decreased, that is, detected to be negative (−), the tactile sensor 100 may detect the shearing force operated in the negative y-axis direction, that is, the downward direction.

Intensity of the shearing force may therefore be calculated using a moving distance of the first electrodes of the upper substrate 110 and using a deformation degree of the dielectric substance 150.

Referring to FIG. 10, when the shearing force or a vertical force is applied to the upper substrate 110 or the lower substrate 120 in the z-axis direction, the dielectric substance 150 becomes flattened or compressed while the first electrodes and the second electrodes connected to the first substrate 110 and the lower substrate 120 remain unmoved. The first electrodes connected to the upper substrate 110 and the second electrodes connected to the lower substrate 120 are moved in the z-axis direction, thereby reducing a distance between the first electrodes and the second electrodes. Accordingly, a distance between the four pairs of the first electrodes and the second electrodes in the first area 210 is reduced. Accordingly, the capacitances of the four pairs of the first electrodes and the second electrodes are all increased. Thus, in the unit set including the four pairs of the first electrodes and the second electrodes, when the capacitances of all of the four pairs of the first electrodes and the second electrodes are increased, that is, detected to be positive (+), the tactile sensor 100 may detect a shearing force operated in the z-axis direction, which is applied vertically to the upper substrate 110 or the lower substrate 120. In addition, the intensity of the vertical force may be calculated using the deformation degree of the dielectric substance 150.

Figure 11:
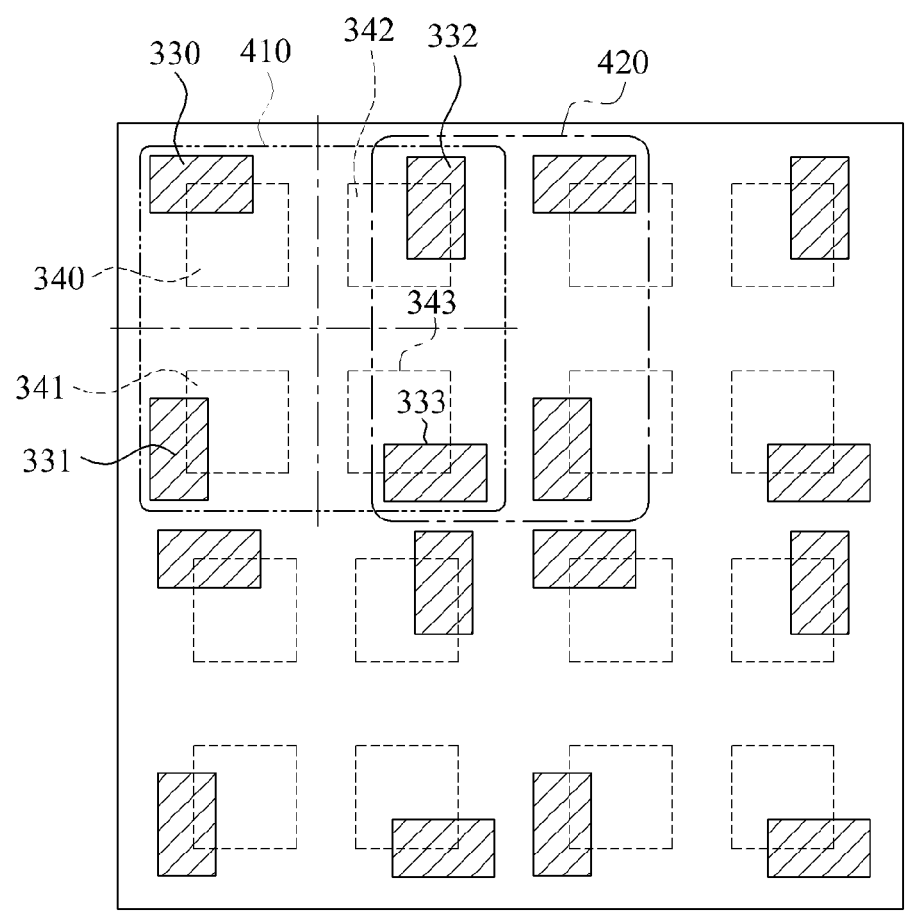
FIG. 11 illustrates a plan view of a tactile sensor according to still other example embodiments.
Figure 12:
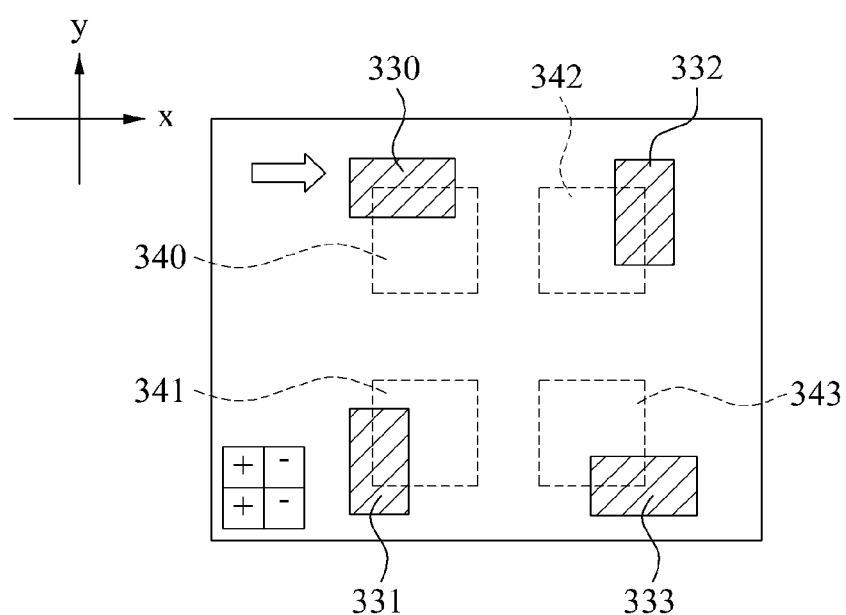
FIG. 12 illustrates variation of a capacitance when a shearing force is applied to a tactile sensor in an x-axis direction according to still other example embodiments.
Figure 13:
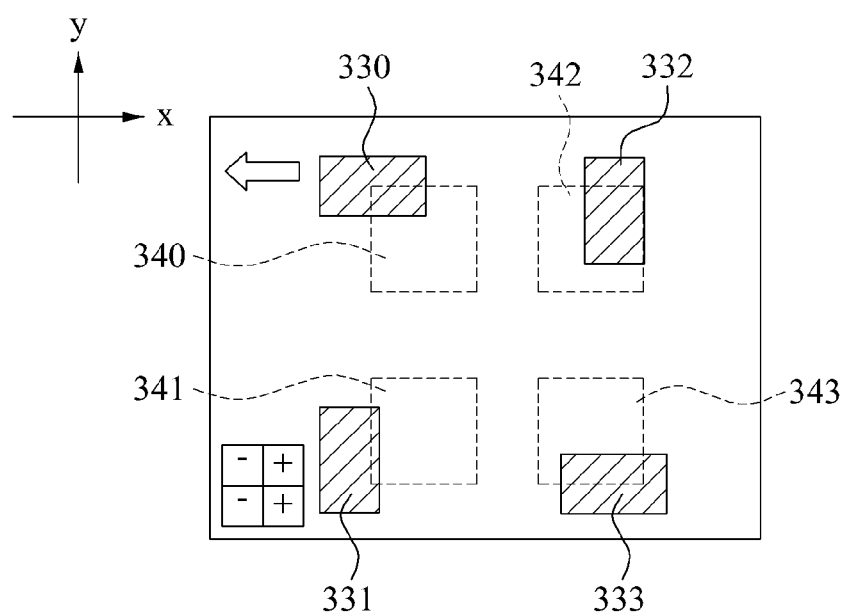
FIG. 13 illustrates variation of a capacitance when a shearing force is applied to a tactile sensor in a negative x-axis direction according to still other example embodiments.
Figure 14:
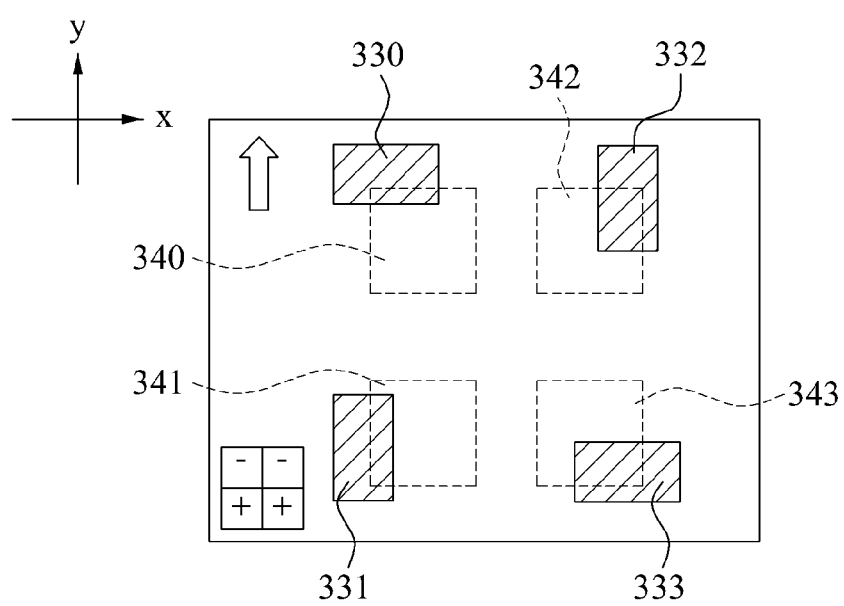
FIG. 14 illustrates variation of a capacitance when a shearing force is applied to a tactile sensor in a y-axis direction according to still other example embodiments.
Figure 15:
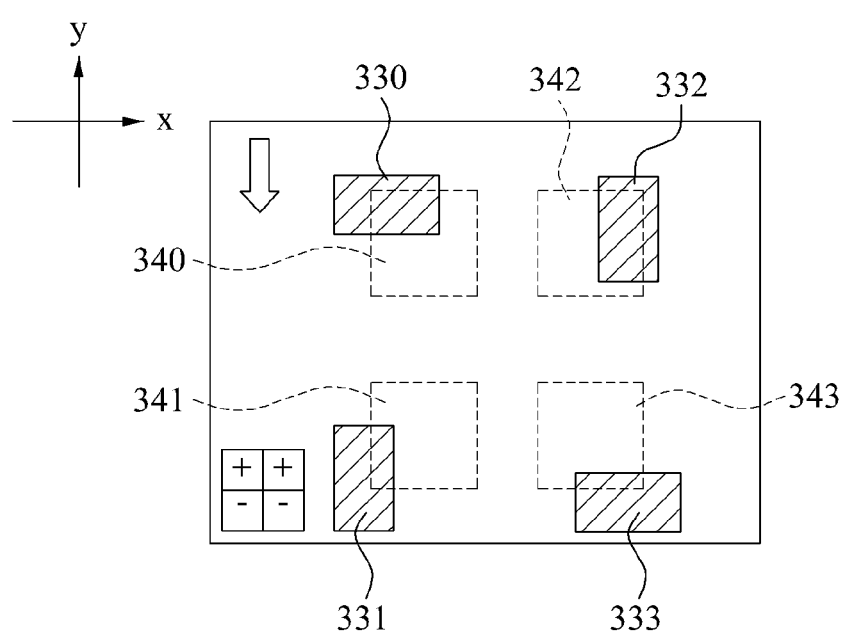
FIG. 15 illustrates variation of a capacitance when a shearing force is applied to a tactile sensor in a negative y-axis direction according to still other example embodiments.

FIG. 11 illustrates a plan view of a tactile sensor according to still other example embodiments. FIG. 12 illustrates variation of a capacitance when a shearing force is applied to the tactile sensor in an x-axis direction. FIG. 13 illustrates variation of a capacitance when a shearing force is applied to the tactile sensor in a negative x-axis direction. FIG. 14 illustrates variation of a capacitance when a shearing force is applied to the tactile sensor in a y-axis direction. FIG. 15 illustrates variation of a capacitance when a shearing force is applied to the tactile sensor in a negative y-axis direction.

Referring to FIGS. 11 to 15, in a manner similar to the previous embodiments, first electrodes 330, 331, 332, and 333 and second electrodes 340, 341, 342, and 343 respectively corresponding to the first electrodes 330, 331, 332, and 333 are arranged in an alternating manner such that the first electrodes 330, 331, 332, and 333 and the second electrodes 340, 341, 342, and 343 only partially overlap each other. Also, in the same manner as the previous embodiments, with respect to a first electrode, a second electrode corresponding to the first electrode may be separated in a predetermined direction. With respect to another first electrode neighboring the foregoing first electrode, a second electrode corresponding to the another first electrode may be separated in a direction opposite to the predetermined direction.

In contrast with previous embodiments, the first electrodes may not be square shaped but instead may be a rectangularly shaped or in an elongated rectangular shape. Therefore, the first electrode and the corresponding second electrode may not line-up symmetrically with the neighboring first electrode and the corresponding second electrode.

In the present example embodiments, before the shearing force is applied to the upper substrate 110, the first electrode 330 and the second electrode 340 are disposed as shown in a first area 410 of FIG. 11.

Referring now to FIG. 12, when the shearing force is applied to the upper substrate 110 in the x-axis direction, first electrodes connected to the upper substrate 110 may be moved in the x-axis direction, that is, rightward, while second electrodes connected to the lower substrate 120 remain unmoved. Therefore, since an area in which two pairs of the first electrodes 330 and 331 and the corresponding second electrodes 340 and 341, which are disposed at a left position, face each other is increased, the capacitances may be increased (+). In addition, since an area in which two pairs of the first electrodes 332 and 333 and the corresponding second electrodes 342 and 343, which are disposed at a right position, face each other is decreased, the capacitances may be decreased (−). Thus, in the unit set including four pairs of the first electrodes and second electrodes, when the capacitances of the first electrode 330 and the second electrode 340 disposed at the upper left position and the first electrode 331 and the second electrode 341 disposed at the lower left position are increased, that is, detected to be positive (+), whereas the capacitances of the first electrode 332 and the second electrode 342 disposed at the upper right position and the first electrode 333 and the second electrode 343 disposed at the right position are decreased, that is, detected to be negative (−), the tactile sensor 100 may detect the shearing force operated in x-axis direction, that is, the rightward direction.

Referring to FIG. 13, when the shearing force is applied to the upper substrate 110 in the negative x-axis direction, first electrodes connected to the upper substrate 110 may be moved in the negative x-axis direction, that is, leftward, while second electrodes connected to the lower substrate 120 remain unmoved. Therefore, since an area in which two pairs of the first electrodes 332 and 333 and the corresponding second electrodes 342 and 343, which are disposed at a right position, face each other is increased, the capacitances may be increased (+). In addition, since an area in which two pairs of the first electrodes 330 and 331 and the corresponding second electrodes 340 and 341, which are disposed at the left position, face each other is decreased, the capacitances may be decreased (−). Thus, in the unit set including four pairs of the first electrodes and second electrodes, when the capacitances of the first electrode 332 and the second electrode 342 disposed at the upper right position and the first electrode 333 and the second electrode 343 disposed at the lower right position are increased, that is, detected to be positive (+), whereas the capacitances of the first electrode 330 and the second electrode 340 disposed at the upper left position and the first electrode 331 and the second electrode 341 disposed at the lower left position are decreased, that is, detected to be negative (−), the tactile sensor 100 may detect the shearing force operated in negative x-axis direction, that is, the leftward direction.

Referring to FIG. 14, when the shearing force is applied to the upper substrate 110 in the y-axis direction, first electrodes connected to the upper substrate 110 may be moved in the y-axis direction, that is, upward, while second electrodes connected to the lower substrate 120 remain unmoved. Therefore, since an area in which two pairs of the first electrodes 331 and 333 and the corresponding second electrodes 341 and 343, which are disposed at a lower position, face each other is increased, the capacitances may be increased (+). In addition, since an area in which two pairs of the first electrodes 330 and 332 and the corresponding second electrodes 340 and 342, which are disposed at the upper position, face each other is decreased, the capacitances may be decreased (−). Thus, in the unit set including four pairs of the first electrodes and second electrodes, when the capacitances of the first electrode 331 and the second electrode 341 disposed at the lower left position and the first electrode 333 and the second electrode 343 disposed at the lower right position are increased, that is, detected to be positive (+), whereas the capacitances of the first electrode 332 and the second electrode 342 disposed at the upper right position and the first electrode 330 and the second electrode 340 disposed at the upper left position are decreased, that is, detected to be negative (−), the tactile sensor 100 may detect the shearing force operated in y-axis direction, that is, the upward direction.

Referring to FIG. 15, when, when the shearing force is applied to the upper substrate 110 in the negative y-axis direction, first electrodes connected to the upper substrate 110 may be moved in the negative y-axis direction, that is, downward, while second electrodes connected to the lower substrate 120 remain unmoved. Therefore, since an area in which two pairs of the first electrodes 330 and 332 and the corresponding second electrodes 340 and 342, which are disposed at the upper position, face each other is increased, the capacitances may be increased (+). In addition, since an area in which two pairs of the first electrodes 331 and 333 and the corresponding second electrodes 341 and 343, which are disposed at the lower position, face each other is decreased, the capacitances may be decreased (−). Thus, in the unit set including four pairs of the first electrodes and second electrodes, when the capacitances of the first electrode 330 and the second electrode 340 disposed at the upper left position and the first electrode 332 and the second electrode 342 disposed at the upper right position are increased, that is, detected to be positive (+), whereas the capacitances of the first electrode 331 and the second electrode 341 disposed at the lower left position and the first electrode 333 and the second electrode 343 disposed at the lower right position are decreased, that is, detected to be negative (−), the tactile sensor 100 may detect the shearing force operated in the negative y-axis direction, that is, the downward direction.

Intensity of the shearing force may be calculated using the moving distance of the first electrodes of the upper substrate 110 and the deformation degree of the dielectric substance 150.

When a vertical force is applied to the upper substrate 110 or the lower substrate 120 in the z-axis direction, the dielectric substance 150 becomes flattened or compressed while the first electrodes and the second electrodes connected to the first substrate 110 and the lower substrate 120 remain unmoved. The first electrodes connected to the upper substrate 110 or the second electrodes connected to the lower substrate 120 are moved in the z-axis direction, thereby reducing a distance between the first electrodes and the second electrodes. Accordingly, a distance between the four pairs of the first electrodes and the second electrodes in the first area 410 is reduced. Accordingly, the capacitances of the four pairs of the first electrodes and the second electrodes are all increased. Thus, in the unit set including the four pairs of the first electrodes and the second electrodes, when the capacitances of all of the four pairs of the first electrodes and the second electrodes are increased, that is, detected to be positive (+), the tactile sensor 100 may detect the shearing force operated in the z-axis direction which is applied vertically to the upper substrate 110 or the lower substrate 120. In addition, the intensity of the vertical force may be calculated using the deformation degree of the dielectric substance 150.

Thus, although a first electrode and a corresponding second electrode are not line symmetrical to another first electrode neighboring the first electrode and a second electrode corresponding to the another first electrode, four different combinations of increase and decrease in the capacitance, the combinations for distinguishing upward, downward, leftward, and rightward directions of the shearing force applied to the upper substrate 110 or the lower substrate 120 may be generated.

Through the foregoing embodiments, the tactile sensing technology for obtaining information on environments through contacts, the information such as a contacting force, vibration, roughness, a temperature change with respect to thermal conductivity, and the like, may be applied not only to a personal assistant robot supporting a human life by providing services but also to various types of medical diagnosis and operations such as an endovascular microsurgery and cancer diagnosis.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents.

Accordingly, other implementations are within the scope of the following claims.

What is claimed is:

1. A tactile sensor comprising:
a first substrate including a plurality of first electrodes;
a second substrate including a plurality of second electrodes corresponding to the plurality of first electrodes; and
a dielectric substance disposed between the first substrate and the second substrate,
wherein a second electrode corresponding to any one of the first electrodes is offset from the any one of the first electrodes in one direction while a second electrode corresponding to another first electrode neighboring the any one of the first electrodes is offset from the another first electrode in a different direction.

2. The tactile sensor of claim 1, wherein the any one of the first electrodes and the second electrode corresponding to the any one first electrode are line symmetrical to the another first electrode and the second electrode corresponding to the another first electrode.

3. The tactile sensor of claim 1, wherein the first electrodes and the second electrodes corresponding to each other only partially overlap.

4. The tactile sensor of claim 1, wherein
a capacitance between at least part of the first electrodes and second electrodes corresponding to the at least part of the first electrodes changes when a shearing force is applied to the first substrate in a first direction, and
the capacitance between the at least part of the first electrodes and the corresponding second electrodes changes when a shearing force is applied to the first substrate in an opposite direction to the first direction.

5. The tactile sensor of claim 4, wherein
a capacitance between at least another part of the first electrodes, other than the at least part of the first electrodes, and second electrodes corresponding to the at least another part of the first electrodes changes when a shearing force is applied to the first substrate in the first direction, and
the capacitance between the at least another part of the first electrodes and the corresponding second electrodes increases or decreases when a shearing force is applied to the first substrate in the opposite direction to the first direction.

6. The tactile sensor of claim 3, wherein
the first substrate is moved horizontally and vertically with respect to the second substrate when a force is applied to the first substrate, and
magnitude and direction of the shearing force applied to the first substrate are measured using a change in an overlapping area between the first electrodes and the second electrodes, and magnitude of a vertical force applied to the first substrate is measured using a change in a distance between the first electrodes and the second electrodes.

7. The tactile sensor of claim 3, wherein
at least four of the first electrodes and at least four of the second electrodes corresponding to the at least four first electrodes form one unit set,
the at least four first electrodes and the at least four second electrodes included in the unit set are separated by predetermined intervals, and
the at least four first electrodes included in the unit set are separated a greater distance from each other than the at least four second electrodes included in the unit set so that an inner edge of the at least four first electrodes overlap with an outer edge of the at least four second electrodes.

8. The tactile sensor of claim 7, wherein
the one unit set comprises four first electrodes and four second electrodes corresponding to the four first electrodes, the four first electrodes and the four second electrodes arranged to respectively form vertices of an imaginary rectangle, and
the four first electrodes are disposed at a longer distance than the four second electrodes from a center of the imaginary rectangle.

9. The tactile sensor of claim 3, wherein a capacitance between at least part of the first electrodes and second electrodes corresponding to the at least part of the first electrodes increases when a vertical force is applied to the first substrate or the second substrate.

10. The tactile sensor of claim 1, wherein the dielectric substance is extensible and compressible.

11. The tactile sensor of claim 10, wherein the dielectric substance is a compound comprising silicone or polymer.

12. The tactile sensor of claim 10, wherein a portion of the dielectric substance that does not overlap with the first electrodes or the second electrodes, is formed as a cavity.

13. The tactile sensor of claim 10, wherein the dielectric substance comprises an air path depressed to allow flow of air.

14. The tactile sensor of claim 1, wherein the first electrodes and the second electrodes are made of graphene.

15. A tactile sensor comprising:
a first substrate including a plurality of first electrodes;
a second substrate including a plurality of second electrodes corresponding to the plurality of first electrodes; and
a dielectric substance disposed between the first substrate and the second substrate,
wherein the first electrodes and the second electrodes are alternately arranged to partially overlap each other, and
wherein a capacitance between at least some of the first electrodes and second electrodes corresponding to the at least some of the first electrodes changes when a shearing force is applied to the first substrate in a first direction, and
wherein the capacitance between the at least some of the first electrodes and the second electrodes corresponding to the at least some of the first electrodes is changed in a manner opposite to when the shearing force is applied to the first substrate in the first direction, when a shearing force is applied to the first substrate in a direction opposite to the first direction.

16. The tactile sensor of claim 15, wherein
a capacitance between at least another part of the first electrodes, other than the at least part of the first electrodes, and second electrodes corresponding to the at least another part of the first electrodes changes when a shearing force is applied to the first substrate in the first direction, and
the capacitance between the at least another part of the first electrodes and the corresponding second electrodes changes in the opposite manner with respect to when the shearing force is applied to the first substrate in the first direction, when a shearing force is applied to the first substrate in the opposite direction to the first direction.

17. The tactile sensor of claim 15, wherein
at least four of the first electrodes and at least four of the second electrodes corresponding to the at least four first electrodes form one unit set,
the at least four first electrodes and the at least four second electrodes included in the unit set are separated by predetermined intervals, and
the at least four first electrodes included in the unit set are separated a greater distance from each other than the at least four second electrodes included in the unit set so that an inner side of the at least four first electrodes overlap with an outer side of the at least four second electrodes.

18. The tactile sensor of claim 17, wherein
the one unit set comprises four first electrodes and four second electrodes corresponding to the four first electrodes, the four first electrodes and the four second electrodes arranged to respectively form vertices of an imaginary rectangle, and
the four first electrodes are disposed at a longer distance than the four second electrodes from a center of the imaginary rectangle.

19. The tactile sensor of claim 15, wherein
the capacitance between at least part of the first electrodes and second electrodes corresponding to the at least part of the first electrodes increases when a vertical force is applied to the first substrate or the second substrate.

20. The tactile sensor of claim 15, wherein the dielectric substance is extensible and compressible.

21. The tactile sensor of claim 20, wherein the dielectric substance is a compound comprising silicone or polymer.

22. The tactile sensor of claim 20, wherein a portion of the dielectric substance that does not overlap with the first electrodes or the second electrodes is formed as a cavity.

23. The tactile sensor of claim 15, wherein the first electrodes and the second electrodes are made of graphene.

24. A sensor comprising:
a first substrate including four first electrodes; and
a second substrate including four second electrodes, which each partially overlap with each of the four first electrodes in a different way, and wherein the first electrodes and the second electrodes are located in different regions, the second substrate being separated from the first substrate.

25. The sensor of claim 24, wherein
a second electrode only partially overlapping with any one of the four first electrodes is separated from the any one first electrode in one direction while a second electrode only partially overlapping with another first electrode neighboring the any one first electrode is separated from the another first electrode in another direction.

26. The sensor of claim 24, wherein
the second electrode overlapping wholly or partially with any one of the four first electrodes is line symmetrical to the second electrode overlapping wholly or partially with the another first electrode neighboring the any one first electrode.

27. The sensor of claim 24, wherein
a capacitance between at least part of the four first electrodes and second electrodes only partially overlapping with the at least part of the four first electrodes changes when a shearing force is applied to the first substrate in the first direction, and
the capacitance between the at least part of the four first electrodes and the second electrodes only partially overlapping with the at least part of the four first electrodes changes when a shearing force is applied to the first substrate in an opposite direction to the first direction.

28. The sensor of claim 27, wherein
the capacitance between the at least another part of the first electrodes, other than the at least part of the first electrodes, and second electrodes corresponding to the at least another part of the first electrodes changes when the shearing force is applied to the first substrate in the first direction, and
the capacitance between the at least another part of the first electrodes and the corresponding second electrodes changes when the shearing force is applied to the first substrate in the opposite direction to the first direction.

29. The sensor of claim 24, wherein
the first substrate is moved horizontally and vertically with respect to the second substrate when a force is applied to the first substrate, and
magnitude and direction of the shearing force applied to the first substrate are measured using a change in an overlapping area between the first electrodes and the second electrodes, and magnitude of a vertical force applied to the first substrate is measured using a change in a distance between the first electrodes and the second electrodes.

30. The sensor of claim 24, wherein
the four first electrodes and the four second electrodes are separated by predetermined intervals, and
the four first electrodes are separated a greater distance from each other than the four second electrodes so that an inner side of the four first electrodes overlap with an outer side of the four second electrodes.

31. The sensor of claim 30, wherein
the four first electrodes and the four second electrodes are arranged to form four vertices of an imaginary rectangle, respectively, and
the four first electrodes are disposed at a longer distance than the four second electrodes from a center of the imaginary rectangle.

32. The sensor of claim 24, wherein a capacitance between at least part of the four first electrodes and second electrodes corresponding to the at least part of the four first electrodes increases when a vertical force is applied to the first substrate or the second substrate.

33. The sensor of claim 24, wherein a dielectric substance is disposed between the first substrate and the second substrate and the dielectric substance is extensible and compressible.

34. The sensor of claim 33, wherein the dielectric substance is a compound comprising silicone or polymer.

35. The sensor of claim 33, wherein a portion of the dielectric substance that does not overlap with the four first electrodes or the four second electrodes is formed as a cavity.

36. The sensor of claim 33, wherein the dielectric substance comprises an air path depressed to allow flow of air.

37. The sensor of claim 24, wherein the four first electrodes and the four second electrodes are made of graphene.

38. A sensor comprising:
a first substrate including four first electrodes; and
a second substrate separated from the first substrate, wherein the second substrate comprises four second electrodes that partially overlap with the four first electrodes and that are separated a greater distance from each other than the four first electrodes are separated from each other.

39. The sensor of claim 38, wherein a second electrode only partially overlapping with any one of the four first electrodes is separated from the any one first electrode in one direction while a second electrode only partially overlapping with another first electrode neighboring the any one of the first electrodes is separated from the another first electrode in another direction.

40. The sensor of claim 38, wherein
any one of the four first electrodes and a second electrode only partially overlapping with the any one first electrode are line symmetrical to another first electrode neighboring the any one first electrode and a second electrode only partially overlapping with the another first electrode.

41. The sensor of claim 38, wherein
a capacitance between at least part of the four first electrodes and second electrodes only partially overlapping with the at least part of the four first electrodes changes when a shearing force is applied to the first substrate in the first direction, and
the capacitance between the at least part of the four first electrodes and the second electrodes only partially overlapping with the at least part of the four first electrodes changes when a shearing force is applied to the first substrate in an opposite direction to the first direction.

42. The sensor of claim 41, wherein
the capacitance between at least another part of the first electrodes, other than the at least part of the first electrodes, and second electrodes corresponding to the at least another part of the first electrodes changes when a shearing force is applied to the first substrate in the first direction, and
the capacitance between the at least another part of the first electrodes and the corresponding second electrodes changes when the shearing force is applied to the first substrate in the opposite direction to the first direction.

43. The sensor of claim 38, wherein
the first substrate is moved horizontally and vertically with respect to the second substrate when a force is applied to the first substrate,
magnitude and direction of the shearing force applied to the first substrate are measured using a change in an overlapping area between the first electrodes and the second electrodes, and magnitude of a vertical force applied to the first substrate is measured using a change in a distance between the first electrodes and the second electrodes.

44. The sensor of claim 38, wherein an outer side of the four first electrodes and an inner side of the four second electrodes overlap with each other.

45. The sensor of claim 44, wherein
the four first electrodes and the four second electrodes are arranged to form four vertices of an imaginary rectangle, respectively, and
the four first electrodes are disposed at a longer distance than the four second electrodes from a center of the imaginary rectangle.

46. The sensor of claim 38, wherein a capacitance between at least part of the four first electrodes and corresponding second electrodes increases when a vertical force is applied to the first substrate or the second substrate.

47. The sensor of claim 38, wherein a dielectric substance is disposed between the first substrate and the second substrate and the dielectric substance is extensible and compressible.

48. The sensor of claim 47, wherein the dielectric substance is a compound comprising silicone or polymer.

49. The sensor of claim 47, wherein a portion of the dielectric substance that does not overlap with the first electrodes or the second electrodes is formed as a cavity.

50. The sensor of claim 47, wherein the dielectric substance comprises an air path depressed to allow flow of air.

51. The sensor of claim 38, wherein the four first electrodes and the four second electrodes are made of graphene.

52. A tactile sensor comprising:
an upper substrate comprising a plurality of first electrodes;
a lower substrate comprising a plurality of second electrodes,
wherein the first electrodes and the second electrodes comprise:
a first group comprising first electrodes and corresponding second electrodes wherein each first electrode of the first group is disposed to be shifted in a first direction with respect to each of the corresponding second electrodes while still partially overlapping each of the corresponding second electrodes of the first group by a first predetermined amount; and
a second group comprising first electrodes and corresponding second electrodes wherein each first electrode of the second group is disposed to be shifted in a second direction with respect to each of the corresponding second electrodes while still partially overlapping each of the corresponding second electrodes of the second group by a second predetermined amount; and
a dielectric disposed between the upper substrate and the lower substrate.

53. A tactile sensor comprising:
an upper substrate comprising a plurality of first electrodes;
a lower substrate comprising a plurality of second electrodes, wherein the first electrodes and the second electrodes comprise:
a first group comprising first electrodes and corresponding second electrodes each disposed to overlap each other by a first predetermined amount; and
a second group comprising first electrodes and corresponding second electrodes each disposed to overlap each other by a second predetermined amount; and
a dielectric disposed between the upper substrate and the lower substrate.

54. A tactile sensor comprising:
an upper substrate comprising a plurality of first electrodes;
a lower substrate comprising a plurality of second electrodes, wherein the first electrodes and the second electrodes comprise:
a first group comprising first electrodes and corresponding second electrodes wherein each first electrode of the first group is disposed to overlap each corresponding second electrode of the first group by a first predetermined amount; and
a second group comprising first electrodes and corresponding second electrodes wherein each first electrode of the second group is disposed to overlap each corresponding second electrode of the second group by a first predetermined amount; and
a dielectric disposed between the upper substrate and the lower substrate.

\* \* \* \* \*